(12) United States Patent
Yoo (10) Patent No.: US 6,303,906 B1
(45) Date of Patent: Oct. 16, 2001

(54) RESISTIVELY HEATED SINGLE WAFER FURNACE

(75) Inventor: Woo Sik Yoo, Palo Alto, CA (US)

(73) Assignee: WaferMasters, Inc., San Jose, CA (US)

(*) Notice: Subject to any disclaimer, the term of this patent is extended or adjusted under 35 U.S.C. 154(b) by 0 days.

(21) Appl. No.: 09/451,494

(22) Filed: Nov. 30, 1999

(51) Int. Cl.[7] .................................................. F27B 5/14

(52) U.S. Cl. .................... 219/390; 118/724; 118/50.1; 392/416; 219/405

(58) Field of Search ................................ 219/390, 405, 219/411; 118/724, 725, 50.1; 392/416, 418

(56) References Cited

U.S. PATENT DOCUMENTS

| | | | |
|---|---|---|---|
| 4,550,245 | 10/1985 | Arai et al. | 219/405 |
| 4,680,451 | 7/1987 | Gat et al. | 219/411 |
| 4,755,654 | 7/1988 | Crowley et al. | 219/405 |
| 4,857,689 | 8/1989 | Lee | 219/10.71 |
| 4,886,954 | 12/1989 | Yu et al. | 219/390 |
| 5,060,354 | 10/1991 | Chizinsky | 29/25.02 |
| 5,114,242 | 5/1992 | Gat et al. | 374/128 |
| 5,155,336 | 10/1992 | Gronet et al. | 219/411 |
| 5,165,796 | 11/1992 | Gat et al. | 374/128 |
| 5,208,643 | 5/1993 | Fair | 356/43 |
| 5,252,807 | 10/1993 | Chizinsky | 219/390 |
| 5,294,778 * | 3/1994 | Carman et al. | 219/385 |
| 5,317,492 | 5/1994 | Gronet et al. | 362/294 |
| 5,387,557 | 2/1995 | Takagi | 437/247 |
| 5,418,885 | 5/1995 | Hauser et al. | 392/416 |
| 5,436,172 | 7/1995 | Moslehi | 437/8 |
| 5,444,217 | 8/1995 | Moore et al. | 219/405 |

(List continued on next page.)

FOREIGN PATENT DOCUMENTS

WO 99/60609   11/1999   (WO) ............. H01L/21/00

OTHER PUBLICATIONS

"Slip–Free Rapid Thermal Processing in Single Wafer Furnace," Woo Sik Yoo et al., Jpn. J. Appl. Phys. vol. 39(2000), pp. L493–L496, Part 2, No. 6A, Jun. 1, 2000, ©2000 The Japan Society of Applied Physics.

"Single Wafer Furnace and Its Thermal Processing Applications," Woo Sik Yoo et al., Jpn. J. Appl. Phys. vol. 39(2000), pp. L694–L697, Part 2, No. 7A, Jul. 1, 2000, ©2000 The Japan Society of Applied Physics.

"SOG Annealing Keeps Its Cool," Woo Sik Yoo and Takashi Fukada, WaferMasters; Jiro Yamamoto, NEC Hiroshima; reprinted from European Semiconductor Aug. 2000.

"Thermal Processing in a Single Wafer Rapid Thermal Furnace," Woo Sik Yoo, Taro Yamazaki, WaferMaster Inc., San Jose, California; Keiichi Enjoji, Tokyo Electron Ltd., Tokyo, Japan; Reprinted from the Jul. 2000 edition of "Solid State Technology," Copyright 2000 by PennWell Corporation.

(List continued on next page.)

Primary Examiner—Teresa Walberg
Assistant Examiner—Shawntina S. Fuqua
(74) Attorney, Agent, or Firm—Skjerven Morrill MacPherson LLP (57) ABSTRACT

A heating apparatus and method for isothermally distributing a temperature across the surface of a semiconductor device during processing. Specifically, a chamber is provided defining a cavity, which is configured to receive a single semiconductor wafer. A plurality of resistive heating elements are provided and advantageously arranged in the cavity. The heating elements are disposed across the chamber and are aligned in close proximity to one another so as to provide an even heating temperature distribution. In accordance with the present invention, the cavity is divided into heating zones. The resistive heating elements are each individually assigned to a zone and are independently controllable. By individually varying the amount of energy emanating from each resistive heating element, an isothermal temperature distribution may be generated across each zone.

18 Claims, 9 Drawing Sheets

U.S. PATENT DOCUMENTS

| | | | |
|---|---|---|---|
| 5,462,603 | 10/1995 | Murakami | 118/719 |
| 5,536,918 * | 7/1996 | Ohkase et al. | 219/390 |
| 5,561,735 | 10/1996 | Camm | 392/416 |
| 5,584,936 | 12/1996 | Pickering et al. | 118/728 |
| 5,635,093 * | 6/1997 | Arena et al. | 219/466 |
| 5,639,301 | 6/1997 | Sasada et al. | 118/52 |
| 5,647,945 | 7/1997 | Matsuse et al. | 156/345 |
| 5,651,670 | 7/1997 | Okase et al. | 432/5 |
| 5,653,808 | 8/1997 | MacLeish et al. | 118/715 |
| 5,654,417 | 8/1997 | Tarr et al. | 536/24.32 |
| 5,654,904 | 8/1997 | Thakur | 364/557 |
| 5,683,518 | 11/1997 | Moore et al. | 118/730 |
| 5,715,361 | 2/1998 | Moslehi | 392/416 |
| 5,830,277 | 11/1998 | Johnsgard et al. | 118/752 |
| 5,837,555 | 11/1998 | Kaltenbrunner et al. | 437/248 |
| 5,872,889 | 2/1999 | Kaltenbrunner et al. | 392/418 |
| 5,903,711 | 5/1999 | Okase | 392/418 |
| 5,908,292 | 6/1999 | Smith et al. | 432/197 |
| 5,930,456 * | 7/1999 | Vosen | 392/416 |
| 6,002,109 | 12/1999 | Johnsgard et al. | 219/390 |
| 6,025,575 * | 2/2000 | Park et al. | 219/405 |

OTHER PUBLICATIONS

"The "Hot Shot" Headed–Platen Rapid Thermal Processor," George Chizinsky, HeatFlow Technologies, 143 West Street, Beverly Farms, MA 01915.

"A Proposed RTP Concept for Low Temperature Applications," George Chizinsky, HeatFlow Technologies, 143 West Street, Beverly Farms, MA 01915.

"Rapid Thermal Processing: Equipment, Technology, and Process", American Vacuum Society/New Mexico Chapter, C. B. Yarling, May 23, 1997.

Woo Sik Yoo et al., "Susceptor–Based Rapid Thermal Processing System and Its Silicide Application", Jpn.J.Appl.Phys., vol. 37 (1998) pp. L1135–L1137, Part 2, No. 10A, Oct. 1, 1998.

Woo Sik Yoo et al., "Highly Reliable, Backside Emissivity Independent Cobalt Silicide Process Using a Susceptor–Based Low Pressure Rapid Thermal Processing System", Jpn.J.Appl.Phys., vol. 37 (1998) pp. L1221–L1223. Part 2. No. 10B. Oct. 15, 1998.

Woo Sik Yoo et al., "Wafer Temperature Characterization in a Susceptor–Based, Low Pressure Rapid Thermal Processing System," 7th Int. Conf. on Advanced Thermal Processing of Semiconductors (RTP '99). Colorado Springs. Sep. 1999. pp. 1–6.

Woo Sik Yoo et al., "Characterization of a Susceptor–Based, Low Pressure RTP System in the Temperature Range of 400–1150° C", 6th Int. Conf. on Advanced Thermal Processing of Semiconductors (RTP '98) Kyoto Japan Sep. 1998 pp. 1–8.

Woo Sik Yoo et al., "Very Thin Cobalt Silicide Formation and Annealing in a Susceptor–Based Low Pressure RTP System," 6th Int. Conf. on Advanced Thermal Processing of Semiconductors (RTP '98), Kyoto, Japan., Sep. 1998, pp. 1–5.

George Chizinsky, "The HotShot Heated–Platen Rapid Thermal Processor", pp. 1–8.

* cited by examiner

RESISTIVELY HEATED SINGLE WAFER FURNACE

BACKGROUND OF THE INVENTION

1. Field of the Invention

This invention generally relates to semiconductor manufacturing equipment and, more particularly, to an apparatus and method used for rapid thermal processing of a single semiconductor wafer.

2. Description of Related Art

In the semiconductor industry, to continue to make advancements in the development of semiconductor devices, especially semiconductor devices of decreased dimensions, new processing and manufacturing techniques have been developed. One such processing technique is know as Rapid Thermal Processing (RTP), which reduces the amount of time that a semiconductor device is exposed to high temperatures during processing. The RTP technique, typically includes irradiating the semiconductor device or wafer with sufficient power to quickly raise the temperature of the wafer and hold it at that temperature for a time long enough to successfully perform a fabrication process, but which avoids such problems as unwanted dopant diffusion that would otherwise occur at the high processing temperatures. Generally, RTP uses a light source and reflectors to heat the wafer. In a conventional rapid thermal processor a lamp is used as the light source because of its low thermal mass, which makes it easy to power up and down very quickly.

Unfortunately, conventional lamp-based RTP systems have considerable drawbacks with regard to uniform temperature distribution. Any single variation in the power output from the lamps can adversely affect the temperature distribution across the wafer. Because most lamp-based systems use lamps with filaments, the wafer is usually rotated to ensure that the temperature non-uniformity due to the filament array is not transferred to the wafer during exposure. The moving parts used to rotate the wafer, add to the cost and complexity of the system. Another particularly troublesome area for maintaining uniform temperature distribution is at the outer edges of the wafer. Most conventional RTP systems have no adequate means to adjust for this type of temperature non-uniformity. As a result, transient temperature fluctuations occur which may cause slip dislocations in the wafer at high temperatures (e.g. ~1000° C.).

Conventional lamp-based RTP systems have other drawbacks. For example, there are no adequate means for providing uniform power distribution and temperature uniformity during transient periods, such as when the lamps are powered on and off. Repeatability of performance is also usually a drawback of lamp-based systems, since each lamp tends to perform differently as it ages. Replacing lamps can also be costly and time consuming, especially when one considers that a given lamp system may have upwards of 180 lamps. The power requirement of the system may also be costly, since the lamps may have a peak power consumption of about 250 kWatts.

For the above reasons, what is needed is an apparatus and method for isothermally distributing a temperature across the surface of a semiconductor device during rapid thermal processing.

SUMMARY OF THE INVENTION

The present invention provides a heating apparatus and method for isothermally distributing a temperature across the surface of a semiconductor device or wafer during processing. The invention provides a potentially slip-free RTP process. In one embodiment, a chamber is provided defining a cavity, which is configured to receive a single semiconductor wafer. As described in greater detail below, a plurality of resistive heating elements are provided and advantageously arranged in the cavity. Preferably, the heating elements are disposed across the chamber and are aligned in close proximity to one another so as to provide an even heating temperature distribution. Advantageously, the resistive heating elements may be positioned above and below the wafer to provide dual-sided heating.

Preferably, in accordance with the present invention, the cavity is divided into heating zones. The resistive heating elements are each individually assigned to a zone and are independently controllable. By individually varying the amount of energy emanating from each resistive heating element, a substantially isothermal temperature distribution may be generated across each zone.

Unlike lamps in a lamp-based RTP system, the resistive heating elements do not require the use of reflectors to evenly distribute the thermal energy. Additionally, the resistive heating elements may be configured into various patterns (e.g. circular, zigzag, and cross-hatched patterns), which may be configured to provide an optimal temperature distribution and reduce the possibility of temperature fluctuations across the surface of the wafer. Advantageously, the heating elements may be covered with a heat diffusing material, which provides uniform temperature dissipation of the heat energy provided by the resistive heating elements.

The present invention overcomes the disadvantages of a lamp-based heating system since the system can provide a more uniform temperature distribution, for less power (e.g. about 5 kWatts) and reduced cost. Fortunately, in the present invention rapid thermal processing can be a potentially slip-free processing technique for a wide range of temperatures and time domains, particularly near the wafer edge.

No moving parts, such as lift pins or wafer spinners, are required within the cavity to load the wafer, nor are other complex and costly components required, such as reflectors, actuators, and complex power transformers and controllers. Since the invention does not require large lamps for heating nor moving parts, the size of the chamber, as well as the volume of the cavity, may be substantially reduced relative to other chambers. The reduced volume and size are of particular advantage for reasons that are made apparent below.

In one aspect of the present invention, an apparatus is provided for rapidly and uniformly heating a wafer during processing. The apparatus includes a process chamber, which defines a cavity configured to receive a wafer. The cavity further defines a plurality of heating zones. The apparatus also includes a plurality of resistive heating elements positioned proximate to the process chamber. Each of the plurality of resistive heating elements may be apportioned to one of the plurality of heating zones. A thermal energy output from each of the resistive heating elements may be capable of heating each of the zones to create a substantially isothermal environment throughout the cavity.

In another aspect of the present invention, a reactor is provided for rapidly and uniformly heating a semiconductor wafer. The reactor includes a chamber, which defines a cavity, which further defines a plurality of heating zones. A plurality of resistive heating elements may be positioned proximate to the chamber, and a portion of the heating elements may be apportioned to each one of the plurality of heating zones. The thermal energy output of each of the resistive heating elements heats the zones to provide a substantially isothermal temperature across each of the zones.

In yet another aspect of the invention, a method is provided for rapidly and uniformly heating a semiconductor wafer. The method includes apportioning a plurality of resistive heating to a heating zone; and creating a thermal output from each of the plurality of resistive heating elements to change the temperature of at least one of the heating zones in response to temperature fluctuations to provide a substantially isothermal environment over the surface of the semiconductor wafer.

These and other features and advantages of the present invention will be more readily apparent from the detailed description of the preferred embodiments set forth below taken in conjunction with the accompanying drawings.

DETAILED DESCRIPTION

Figure 1A:
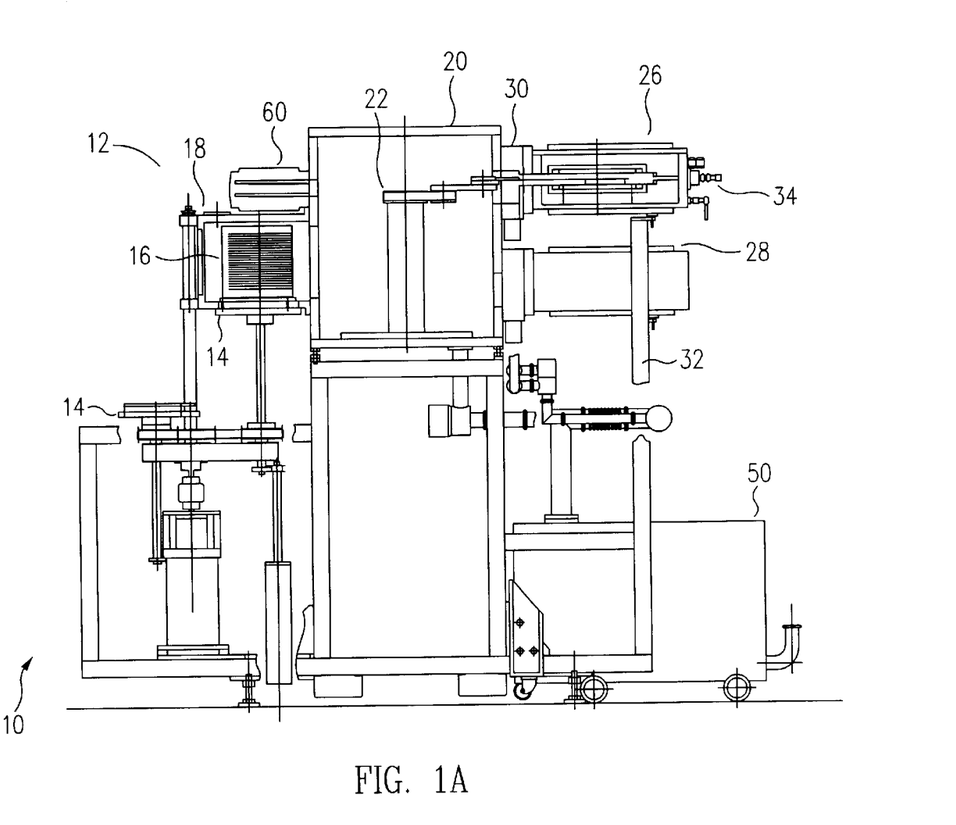
FIGS. 1A and 1B are schematic illustrations of a side view and top view, respectively, of one embodiment of a semiconductor wafer processing system for use with the present invention.
Figure 1B:
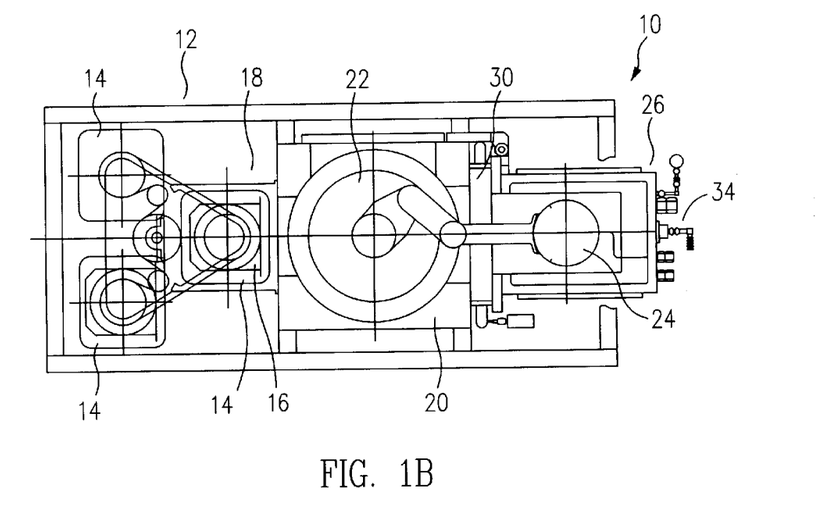

FIGS. 1A and 1B are schematic illustrations of a side view and top view, respectively, of one embodiment of a semiconductor wafer processing system 10 that establishes a representative environment of the present invention. The representative system is fully disclosed in copending U.S. patent application Ser. No. 09/451,677, filed Nov. 30, 1999, which is herein incorporated by reference for all purposes. Processing system 10 includes a loading station 12 which has multiple platforms 14 for supporting and moving a wafer cassette 16 up and into a loadlock 18. Wafer cassette 16 may be a removable cassette which is loaded into a platform 14, either manually or with automated guided vehicles (AGV). Wafer cassette 16 may also be a fixed cassette, in which case wafers are loaded onto cassette 16 using conventional atmospheric robots or loaders (not shown). Once wafer cassette 16 is inside loadlock 18, loadlock 18 and transfer chamber 20 are maintained at atmospheric pressure or else are pumped down to a vacuum pressure using a pump 50. A robot 22 within transfer chamber 20 rotates toward loadlock 18 and picks up a wafer 24 from cassette 16. A reactor or thermal processing chamber 26, which may also be at atmospheric pressure or under vacuum pressure, accepts wafer 24 from robot 22 through a gate valve 30. Optionally, additional reactors may be added to the system, for example reactor 28. Robot 22 then retracts and, subsequently, gate valve 30 closes to begin the processing of wafer 24. After wafer 24 is processed, gate valve 30 opens to allow robot 22 to pick-up and place wafer 24 into cooling station 60. Cooling station 60 cools the newly processed wafers before they are placed back into a wafer cassette in loadlock 18.

In accordance with the present invention, reactors 26 and 28 are RTP reactors, such as those used in thermal anneals. In other embodiments, reactors 26 and 28 may also be other types of reactors, such as those used for dopant diffusion, thermal oxidation, nitridation, chemical vapor deposition, and similar processes. Reactors 26 and 28 are generally horizontally displaced, however in a preferred embodiment, reactors 26 and 28 are vertically displaced (i.e. stacked one over another) to minimize floor space occupied by system 10. Reactors 26 and 28 are bolted onto transfer chamber 20 and are further supported by a support frame 32. Process gases, coolant, and electrical connections may be provided through the rear end of the reactors using interfaces 34.

Figure 2:
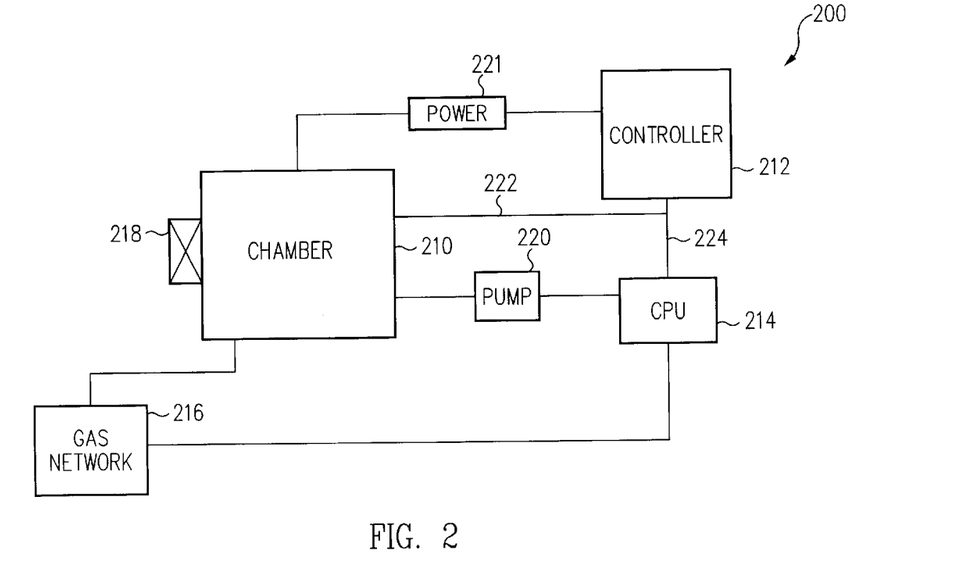
FIG. 2 is a block diagram of an embodiment of an RTP reactor system in accordance with the present invention.

A simplified block diagram of an RTP reactor system of the present invention is shown in FIG. 2. In a preferred embodiment, reactor system 200 may include a reactor chamber 210, a controller 212, a process control computer 214, a gas network 216, a compact gate valve assembly 218, and a pump assembly 220. Each component of the system is described in greater detail below.

Figure 3:
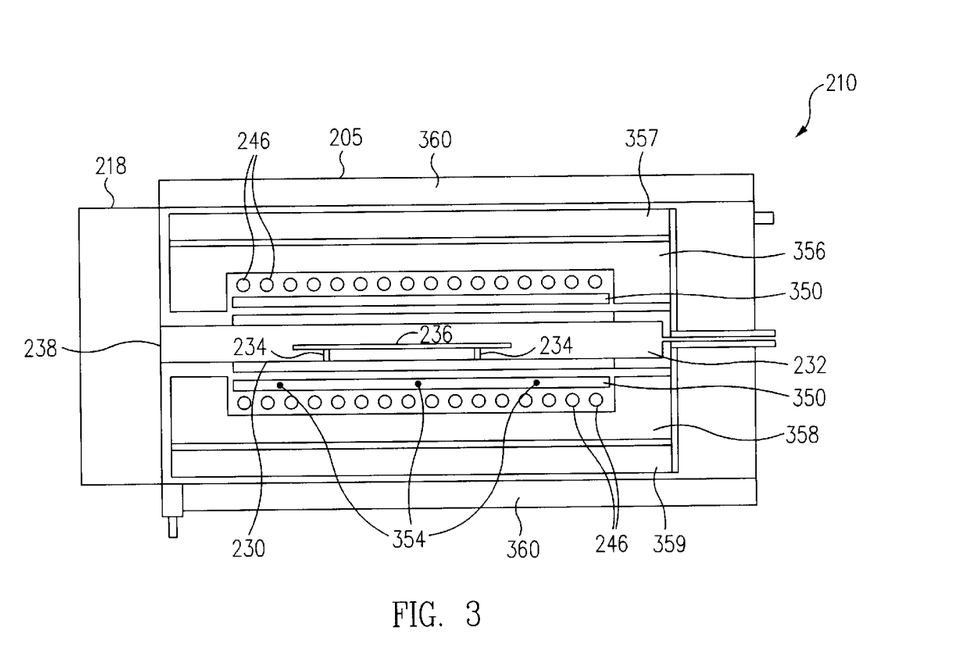
FIG. 3 is a simplified cross-sectional view of a reactor chamber as in FIG. 2, in accordance the principles of the present invention.

Referring now to FIG. 3, a simplified cross-sectional view of reactor chamber 210 is shown in accordance with one embodiment of the present invention. Externally, reactor chamber 210 may be a metallic shell 205, preferably made of aluminum or similar metal, having an opening provided on a face of shell 205, configured to receive a wafer for processing. Optionally, to protect users and/or equipment near chamber 210, the chamber may include thermal insulation layers 356, 357, 358, and 359. The layers may be made of any suitable insulation, such as a ceramic fiber material. Alternatively, a detachable water cooled jacket 360 or similar device may be used to surround chamber 210. The water cooled jacket 360 ensures that the reactor does not become too hot, so as to be a hazard to nearby equipment or personnel.

For ease of understanding, the embodiments of reactor chamber 210 shown in FIG. 3 are described as three sections. Each section has components grouped according to the general function performed by the particular section. The sections include: The processing chamber section, the heating section, and the wafer load/unload section.

As shown in FIG. 3, the processing chamber section may generally include a closed-end process chamber or tube 230, which defines an interior cavity 232. In one embodiment, tube 230 may be constructed with a substantially rectangular cross-section, having a minimal internal volume surrounding wafer 236. In this embodiment, the volume of tube 230 is usually no greater than 5000 cm$^3$, preferably the volume is less than about 3000 cm$^3$. One result of the small volume is that uniformity in temperature is more easily maintained. Additionally, the small tube volume allows reactor chamber 210 to be made smaller, and as a result, system 100 may be made smaller, requiring less clean room floor space. The smaller reactor size, in conjunction with the use of the robot loader, allows multiple reactors to be used in system 100 by vertically stacking the reactors as shown in FIG. 1A. Tube 230 is made of quartz, but may be made of silicon carbide, $Al_2O_3$, or other suitable material.

To conduct a process, quartz tube 230 should be capable of being pressurized. Typically, tube 230 should be able to withstand internal pressures of about 0.001 Torr to 1000 Torr, preferably between about 0.1 Torr and about 760 Torr.

In another embodiment, within tube 230 are wafer support standoffs 234, which support the single wafer 236. Standoffs 234 may be any high temperature resistant material, such as quartz. Standoffs 234 may have a height of between about 50 μm and about 20 mm. In order to monitor the temperature of wafer 236 during processing, at least one thermocouple may be embedded into at least one standoff 234.

An opening or aperture 238 at the left end of tube 230 provides access for the loading and unloading of wafer 236 before and after processing. Aperture 238 may be a relatively small opening, but with a height and width large enough to accommodate a wafer of between about 0.5 to 2 mm thick and up to about 300 mm (~12 in.) in diameter, and robot arm 22 passing therethrough. The height of aperture 238 is no greater than between about 18 mm and 50 mm, and preferably, no greater than 20 mm. The relatively small aperture size helps to reduce radiation heat loss from tube 230. Also, the small aperture size keeps down the number of particles entering cavity 230 and allows for easier maintenance of the isothermal temperature environment. In one embodiment, during a processing procedure an edge of wafer 236 may be no less than 50 mm from aperture 238 when the wafer is placed on standoffs 234.

Figure 4:
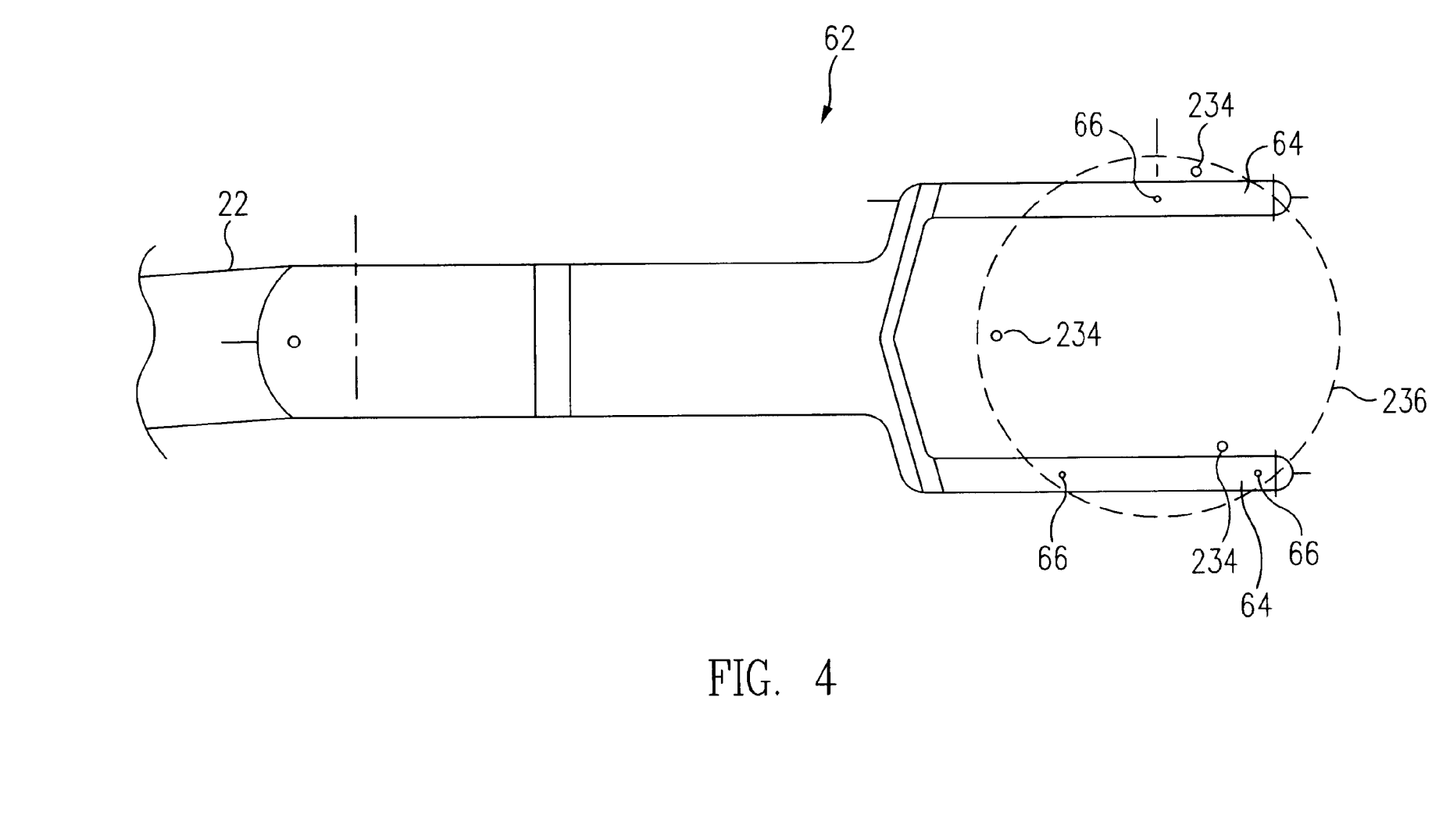
FIG. 4 is a simplified top view of an end effector with a wafer (shown in phantom) in accordance with the present invention.

FIG. 4 is a simplified schematic illustration of robot arm 22 loading wafer 236 onto standoffs 234. As shown in FIG. 4, at the end of robot arm 22 is an end effector 62. In one embodiment, robot arm 22 urges end effector 62 through aperture 238 and subsequently lowers wafer 236 onto standoffs 234. To hold and transport wafer 236, end effector 62 may have any number of prongs 64, usually one or more, preferably two. Prongs 64 are sized and spaced apart from each other so that as end effector 62 enters tube 230, prongs 64 avoid contacting standoffs 234. Each prong 64 of end effector 62 has at least one wafer contact point 66. Preferably, end effector 62 has a total of at least three contact points. Contact points 66 are designed with a minimal surface area to provide a minimum of contact area between wafer 236 and contact points 66. In a preferred embodiment, the total contact area between contact points 66 and wafer 236 may be less than about 350 $mm^2$, preferably less than 300 $mm^2$.

Figure 5:
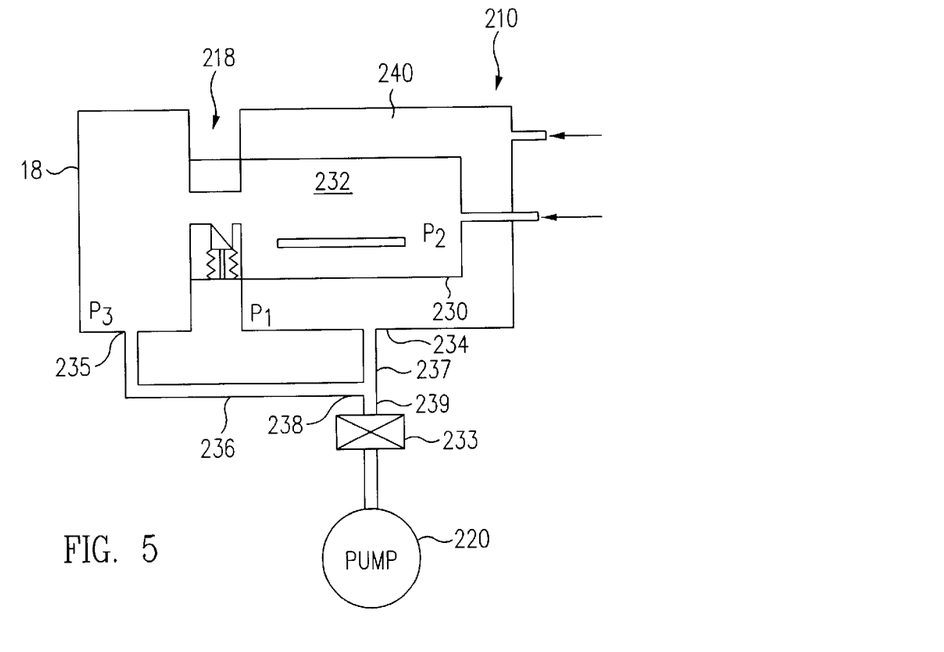
FIG. 5 is a simplified schematic illustration of an embodiment of the present invention.

FIG. 5 shows an alternative embodiment of reactor chamber 210, which may help to maintain the structural integrity of quartz tube 230 during high temperature processing. In this embodiment, an external cavity 240 may be formed around tube 230 and filled with air, or preferably, $N_2$, $O_2$, or other process gases. Using pure gases to fill the external cavity may help to extend the usage life of other components, such as heating elements, which may be housed in cavity 240. In a preferred embodiment, external cavity 240 may be maintained having at least an equal or lower pressure than interior cavity 232 ($P_1 \leq P_2$). In one embodiment, tube 230 may be in communication with loadlock 18, typically through gate valve 218, such that the pressure in tube 230 may be equal to the pressure in loadlock 18 ($P_2=P_3$). In this embodiment, the pressure differential between external cavity 240 and tube 230 creates a force on the internal walls of tube 230. To create the pressure differential external cavity 240 is evacuated directly at orifice 234 and through pump pipe 237. Tube 230 is evacuated through loadlock 18 at orifice 235 and through loadlock pipe 236. Pump pipe 237 and loadlock pipe 236 meet at tube intersection 238 and proceed as one pipe 239 to pump assembly 220. Since the combined volume of loadlock 18 and tube 230 is greater than the volume of external cavity 240, it follows that the pressure in external cavity 240 can be less than that in the combined loadlock 18 and tube 230 configuration. In this manner, the internal pressure in tube 230 can be used to fortify tube 230 against failure, and ensures that the structural integrity of tube 230 is maintained.

Pump assembly 220 may include any suitable pump for creating the required process pressures within chamber 210. Pump assembly 220 may also serve other purposes, as are generally required of a pump in a processing system. For example, pump assembly 220 may be used to pump down or create a vacuum in process chamber 230, such that the cool down rate within the chamber can be controlled. An exemplary pump assembly may include mechanical pump model HC-60B available from Kashiyama Industries Ltd.

Figure 6:
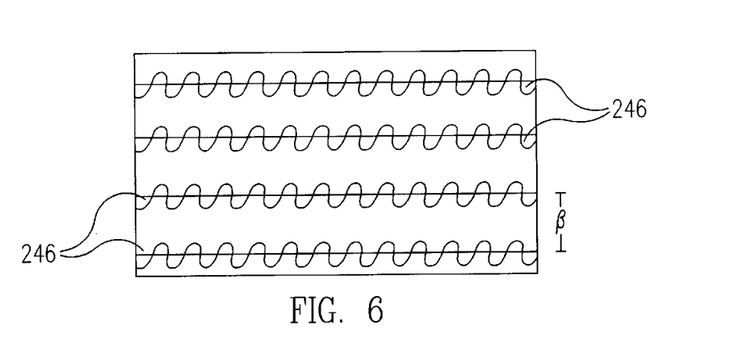
FIG. 6 is a simplified illustration of an embodiment of resistive heating elements in accordance with the present invention.

Referring again to FIG. 3, the heating section of the present invention is configured to surround the process chamber section. The heating section includes heating elements, preferably resistive heating elements 246. In a preferred embodiment, a plurality of heating elements 246 are used to surround a top and a bottom portion of tube 230. In one embodiment, shown in FIG. 6, resistive heating elements 246 may be disposed in parallel across chamber 210. Each element 246 is in relative close proximity to each other element. For example, each resistive heating element 246 may be spaced a distance β from the next closest heating element, which may be between about 5 mm and 50 mm, preferably between about 10 mm and 20 mm. Accordingly, the close spacing of heating elements 246 provides for an even heating temperature distribution across the wafer positioned in cavity 232.

Figure 6A:
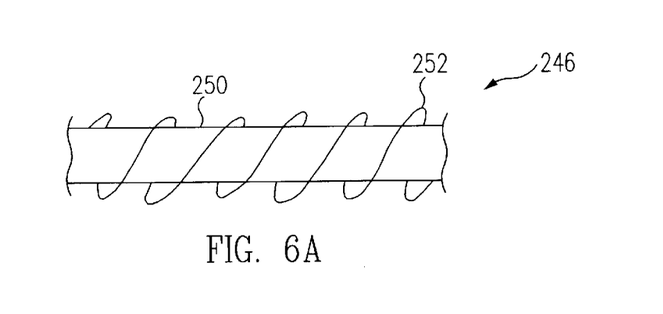
FIG. 6A is a simplified illustration of a portion of an embodiment of a resistive heating element of the present invention.

FIG. 6A shows an exemplary heating element 246, in accordance with the principles of the present invention. Resistive heating element 246 includes a resistive heating element core 250 and a filament wire 252. Core 250 is usually made of a ceramic material, but may be made of any high temperature rated, non-conductive material. Filament wire 252 is conventionally wrapped around core 250 to allow for an optimal amount of radiated heat energy to emanate from the element. Filament wire 252 may be any suitable resistively heatable wire, which is made from a high mass material for increased thermal response and high temperature stability, such as SiC, SiC coated graphite, graphite, NiCr, AlNi and other alloys. Preferably, resistive heating filament wire 252 is made of a combination Al—Ni—Fe material, known commonly as Kantal A-1 or AF, available from Omega Corp. of Stamford, Conn.

Figure 6B:
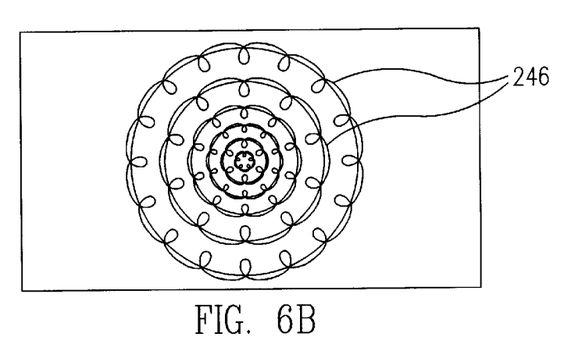
FIGS. 6B–6D are simplified illustrations of embodiments of resistive heating elements in accordance with the present invention.
Figure 6C:
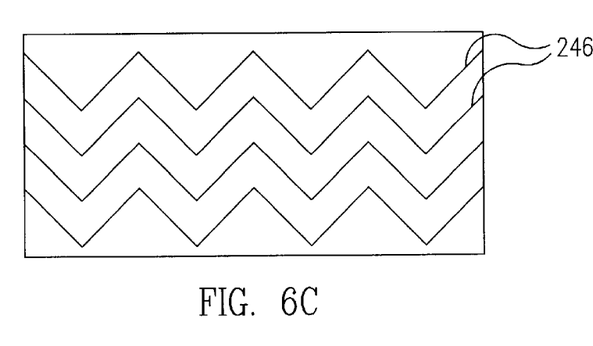
Figure 6D:
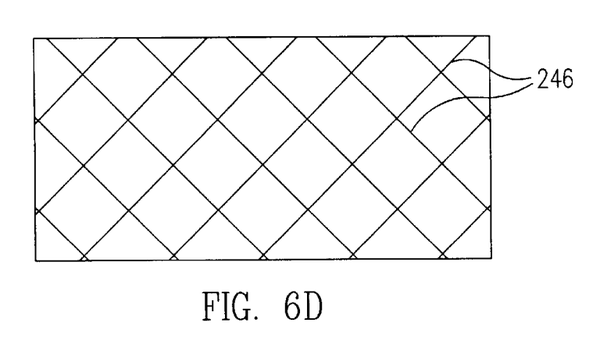

Optionally, as shown in FIGS. 6B–6D, resistive heating elements 246 may be positioned in various configurations which may include, for example, circular, zigzag, cross-hatched patterns and the like. The variable patterns may be able to provide more optimal temperature distribution and further reduce the possibility of temperature fluctuations across the surface of the wafer. Advantageously, a direct line voltage of between about 100 volts and about 500 volts may be used to power the resistive elements. Thus, no complex power transformer is needed in the present invention for controlling the output of resistive heating elements 246.

Referring to FIGS. 7A–7D and once again to FIG. 3, the loading/unloading section of chamber 210 includes gate valve assembly 218, which is generally coupled to external shell 205 at aperture 238. Housed within gate valve main body 300 and aligned along the valve central axis 301 are gate 304, bellows 306, plumbing interface 308, linear drive shaft 310, and actuator 326, all assembled together to provide gate valve assembly 218. In a preferred embodiment, valve main body 300 defines a port 317. Port 317 has a first end 321, which provides initial access to the reactor through gate valve 218, and a second end 323, which has an aperture or opening 302 configured to mate with aperture 238 of quartz tube 230. The geometry and dimensions of valve aperture 302 generally correspond to those of reactor aperture 238, so that valve aperture 302 and reactor aperture 238 can be used together to provide a seal, which maintains a selected vacuum or pressurized environment within tube 230 or isolates cavity 232 during wafer processing operations.

Figure 7A:
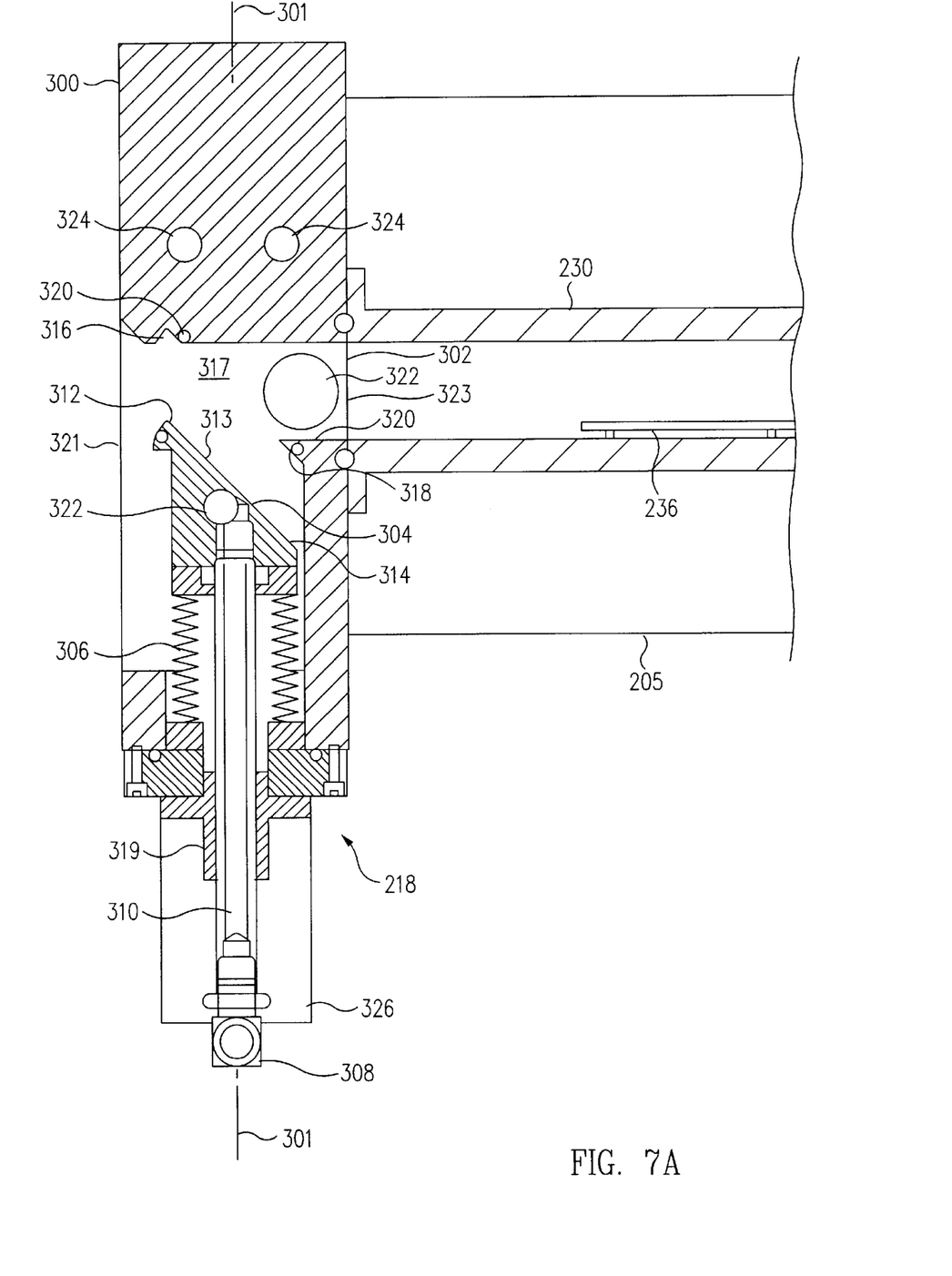
FIGS. 7A–7C are various views of an embodiment of the compact gate valve assembly of the present invention.
Figure 7B:
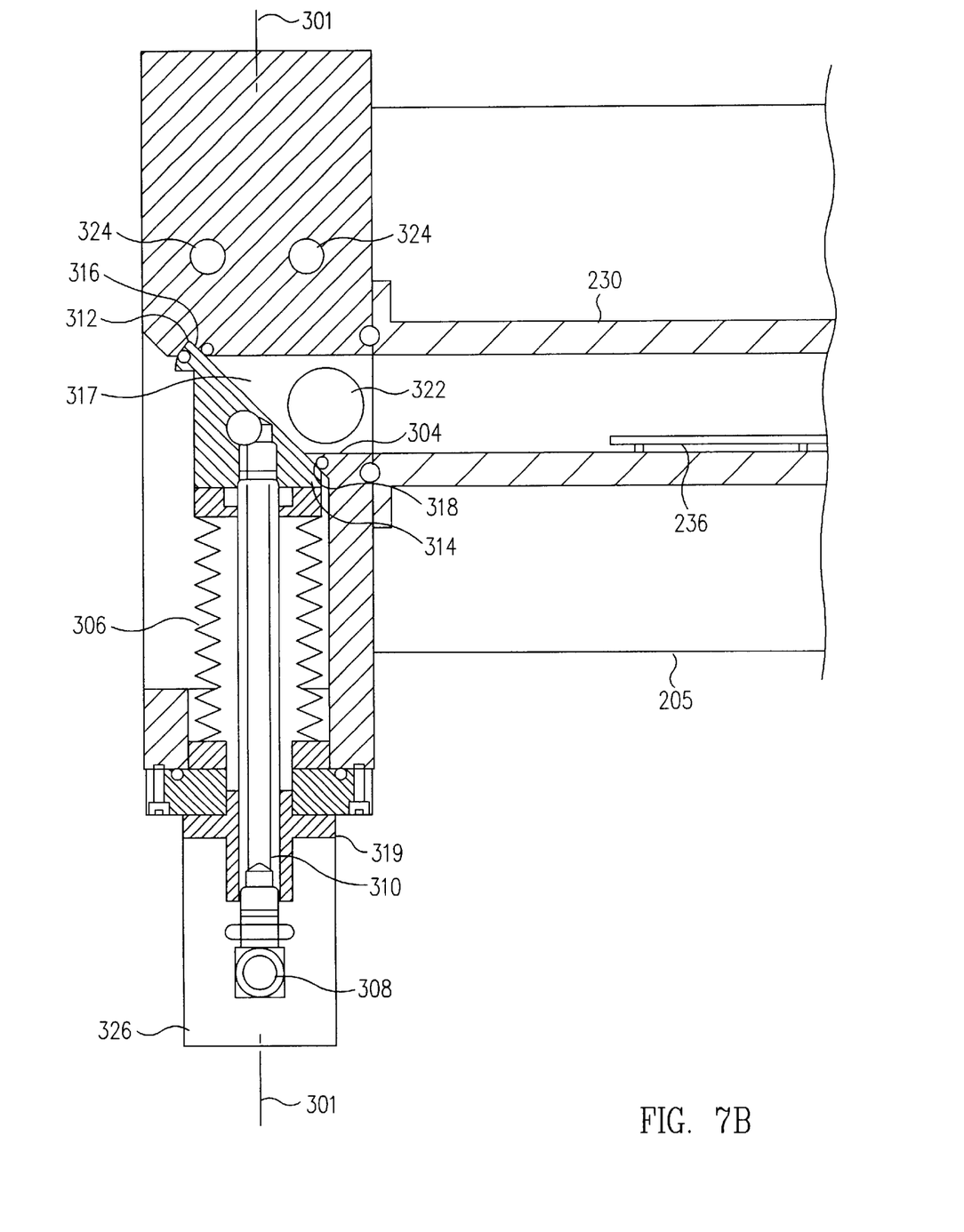
Figure 7C:
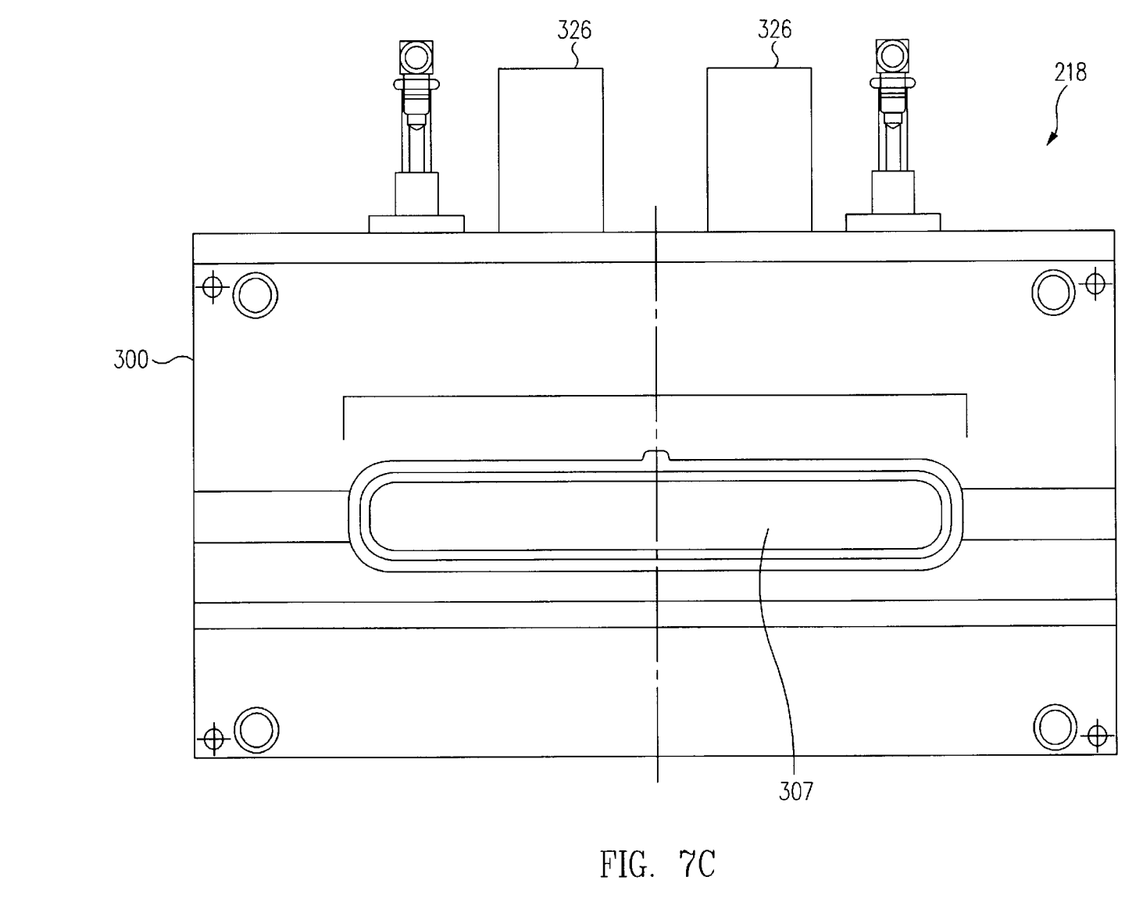

Gate 304 is an elongated plate mounted at an upper end of drive shaft 310. The elongated plate is well suited for sealing slot-type openings, such as valve aperture 302. It should be understood that the geometry of gate 304 may be changed to accommodate differently shaped openings. Preferably, as shown in FIGS. 7A and 7B, gate 304 may be sloped relative to central axis 301 to form inclined surface 313. Inclined surface 313 may be sloped at any angle, such as between about 5° and about 85°, which is adequately suited to allow for the proper performance of the present invention. In a preferred embodiment, inclined surface 313 is angled at between about 30° and about 60°, more preferably about 45° to axis 301. On a top and bottom portion of inclined surface 313 are contact portions 312 and 314, which extend along the elongated length of gate 304. In a preferred embodiment, inclined surface 313 may have a highly polished surface or may be coated with a heat/radiation reflective coating, such as gold, silver, Ni, Molybdenum, or other metal with a high melting point relative to the process temperatures. The reflective surface may reflect radiation energy, which may leak through valve aperture 302, back into tube 230.

By way of example, when drive shaft 310 is moved up into main body 300, gate 304 is moved upward, into port 317 (FIG. 7B). Drive shaft 310 is moved up and/or down through linear guide 319 by a linear action created using actuator 326. In the preferred embodiment, to move drive shaft 310, actuator 326 is supplied at plumbing interface 308 with a conventional incompressible fluid, such as water or alcohol. The supply of fluid causes drive shaft 310 to move linearly through linear guide 319 into main body 300.

By moving linear shaft 310 vertically upward, as described in FIG. 7A, linear shaft 310 drives the expansion of bellows 306. Bellows 306 surrounds shaft 310 along axis 301. In this embodiment, bellows 306 establishes a vacuum seal between actuator 326 and main body 300 to ensure that tube 230 is not contaminated from the outside environment during opening and closing of the valve.

Figure 7D:
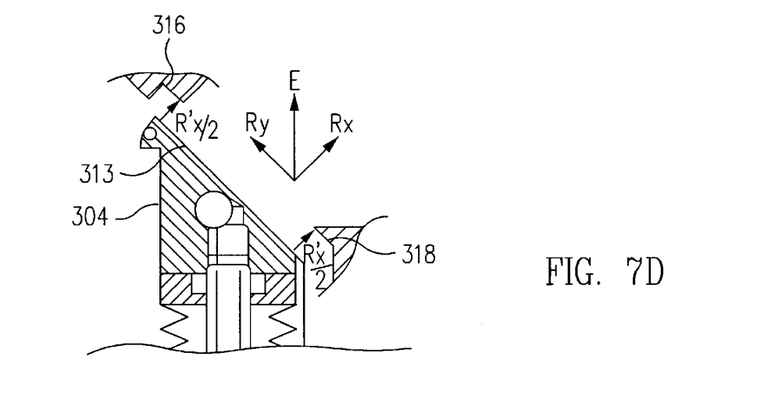
FIG. 7D is a simplified illustration of force vectors acting upon the gate valve assembly of FIGS. 7A–7C in accordance with one embodiment of the present invention.

As shown in FIG. 7D, when linear shaft 310 reaches the end of its effective travel length (See FIG. 7B), portions 312 and 314 of gate 304 contact sealing surfaces 316 and 318, respectively, with a force F to create the positive seal, which isolates tube 230. Inclined surface 313 causes force F to create reaction forces Rx and Ry at contact surfaces 316 and 318. The reaction force Rx acts equally on contact surfaces 316 and 318, as shown in FIG. 7D, normal to inclined surface 313. It should be understood that the horizontal force component Rx, which provides the sealing force that causes gate 304 to form a positive seal with contact surfaces 316 and 318 at opening 302. Beneficially, since the sealing force can be provided without the need for a horizontal action or horizontal movement of shaft 310 or gate 304, gate valve 218 may be designed with a reduced profile and size. It is another advantage of the present invention that when a vacuum is drawn in tube 230, outside pressure forces the inclined surface 313 against contact surfaces 316 and 318 and O-ring 320 to create the seal. Because of the O-ring, sliding contact between the inclined surface 313 and the contact surfaces 316 and 318 is substantially avoided. The portions of inclined surface 313 which may contact the gate main body, may also be coated with a soft buffer material to avoid metal-to-metal sliding contact, which helps to avoid the creation of contaminating particles.

To re-open the valve from the closed configuration, gate 304 is removed from bore 317 when drive shaft 310 is moved down and out from main body 300 through linear guide 319 (FIG. 7A) by actuator 326, thus removing the sealing force from gate 304 to open bore 317 for loading/un-loading of the wafer.

Additionally, gate valve 218 also has an exhaust port 322, which allows for controlling of the process chamber pressure. Also, cooling fluid ports 324 are provided, which allow a coolant to flow so as to reduce the external temperature of the gate valve main body during RTP.

Figure 8:
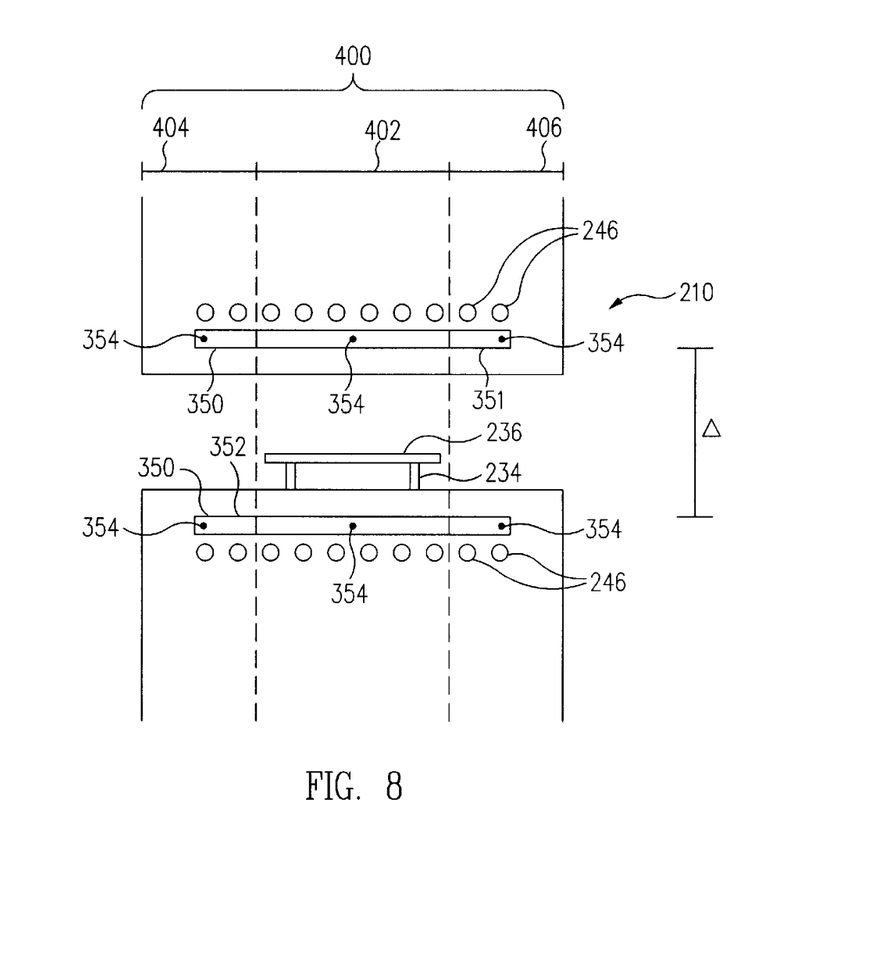
FIG. 8 is a simplified illustration of the embodiment of FIG. 3 showing temperature zones in accordance with the present invention.

As better understood with reference to FIG. 8, in conjunction with FIG. 2, in a preferred embodiment, reactor chamber 210 may include up to any number of heating zones 400. In the embodiment shown in FIG. 8, reactor chamber 210 has three parrallel heating zones, which includes a central zone 402 and two adjacent outer zones 404 and 406. In an alternative embodiment, shown in FIG. 6B, the heating elements may be in a circular configuration and therfore may include at least two heating zones, a central inner zone and an outer zone. Referring again to FIG. 8, each heating element 246 can be apportioned to a specific heating zone 402, 404, and 406. As described in more detail below, each heating zone 402, 404, and 406 has at least one temperature sensor 354, which provides feedback to controller 212. Accordingly, as fluctuations in temperature within a heating zone 402, 404, and/or 406 are sensed by temperature sensors 354, real-time controller 212 (FIG. 2) can cause the power from power supply 221 (FIG. 2) to increase or decrease, as necessary, to increase or decrease the energy output (heat) from each of resistive elements 246. For example, if a drop in temperature is sensed in zone 404, the thermal energy output from resistive heating elements 246 apportioned to zone 404, increases until the temperature in zone 404 is returned to the desired level. In this manner, the temperature from zone-to-zone across the surface of wafer 236 may be kept substantially isothermal.

The number of resistive elements 246 apportioned to each zone may vary based on the energy output desired per zone. The size of each zone (i.e. the heating volume) is also variable. In a preferred embodiment, central zone 402 can encompass at least one wafer of up to about 300 mm in diameter. For example, as shown in FIG. 8, when placed on standoffs 234, wafer 236 is fully within the boundary of zone 402 as indicated by the dashed lines. Advantageously, the size of each zone can be scaled up or down as desired. For example, zone 402 can be scaled up for processing of larger wafers, by re-apportioning heating elements 246 from zone 404 to zone 402. This means that the number of heating elements 246 assigned to zone 402 is increased, while the number of heating elements assigned to zone 404 is decreased. The heating elements added to zone 402 are controlled by controller 212 (FIG. 2) to responed in the same manner as the heating elements already assigned to zone 402.

In yet another embodiment, shown in FIGS. 3 and 8, chamber 210 includes heat diffusing members 350, which are positioned proximate to and typically overlay heating elements 246. Heat diffusing members 350 absorb the thermal energy output from heating elements 246 and dissipate the heat evenly within tube 230. It should be appreciated that by heating wafer 236 from above and below, and further by keeping the distance Δ between heat diffusing members 350 small, the temperature gradient within tube 230 is more easily isothermally maintained. For example, if top heat diffusing member 351 is maintained at 1000° C. and bottom heat diffusing member 352 is also maintained at 1000° C., the temperature gradient in the small space between them should also be substantially maintained at 1000° C. with very little fluctuation. Heat diffusing members 350 may be any suitable heat diffusing material that has a sufficiently high thermal conductivity, preferably Silicon Carbide, $Al_2O_3$, or graphite. In a preferred embodiment, temperature sensors 354, preferably thermocouples, are embedded within heat diffusing members 350. Thermocouples 354 are strategically placed such that they can provide feedback as to the temperature conditions of the heat diffusing members. For example, at least one thermocouple 354 is placed at each end and at the center of heat diffusing members 351 and 352. In this configuration, the temperature of each zone 402, 404, and 406 can be monitored with feedback provided to controller 212 (FIG. 2). By positioning the thermocouples 354 at known positions on the heat diffusing members 350, the temperture gradient can be determined with reference to a position within tube 230. This data is used by controller 212 to control the temperature within each zone 402, 404, and 406 more precisely. Thermocouples 354 are conventional R-type or K-type thermocouples available from Omega Corporation of Stamford, Conn.

A microprocessor or process control computer 214, generally controls the processing of a semiconductor wafer placed in the RTP reactor and may be used to monitor the status of the system for diagnostic purposes. In one embodiment, process computer 214 provides control signals to controller 212 in response to temperature data received from temperature sensors 354 in chamber 210. Process computer 214 may also direct pressure setpoints to pump assembly 220 as well as gas and plasma inlet flow signals to mass-flow controllers in gas network 216. In one embodiment, controller 212 is a real-time Proprtional Integral Derivitive (PID), multi-zone controller, available from Omega Corporation. Controller 212 provides control signals to a SCR-based phase controlled power supply 221, which provides power to the resistive heating elements provided in chamber 210. In operation, the multi-zone controller receives temperature sensor outputs via sensing line 222 from chamber 210, as well as the desired wafer temperature setpoint from computer 214 via line 224 and delivers controlled power setpoints to the heating element power supply 221. As described in greater detail below, the heating elements increase or decrease their energy output in response to the increase or decrease in power supplied from power supply 221.

A primary advantage of the present invention is the ability to conduct substantially slip free RTP of a silicon wafer. The advantages of embodiments of the present invention will be further understood by reference to the following parameters, which are provided below to illustrate the present invention and not to limit or restrict it.

In one exemplary embodiment, in order to conduct substantially slip-free RTP in chamber 210 in accordance with the present invention, the following parameters should be used. A wafer having a diameter of 150 mm or greater is loaded into the processing chamber of the present invention. The wafer is loaded using an end effector that has one or more wafer contact points with a cumulative contact point area no greater than 300 $mm^2$. The loading/unloading speed of the wafer is done between about 50 mm/s and about 600 mm/s in the horizontal plane and between about 5 mm/s and about 100 mm/s in the vertical plane. The wafer is placed on one or more standoffs positioned within the chamber. The standoffs will generally have a height of between about 50 μm and about 20 mm. The total contact area between the standoffs and the wafer is less than about 350 $mm^2$, preferably less than about 300 $mm^2$. The processing may occur at temperatures between about 900° C. and 1200° C., preferably between 1000 ° C. and 1200° C., at a chamber pressure of between 0.1 Torr and about 1000 Torr, preferably at atmospheric pressure.

It should be understood that the wafer described above may be made of conventional materials commonly used in the industry, such as silicon, gallium arsenide, or other similar compound or the wafer may be a semiconductor wafer, made from quartz or glass.

Having thus described the preferred embodiments, persons skilled in the art will recognize that changes may be made in form and detail without departing from the spirit and scope of the invention. Thus the invention is limited only by the following claims.

What is claimed is:

1. An apparatus for rapidly and uniformly heating a wafer during processing, the apparatus comprising:
   a process chamber having a top portion and a bottom portion, said process chamber defining a cavity configured to receive a wafer therein; and
   a plurality of resistive heating elements positioned adjacent to said top portion and said bottom portion of said process chamber, each of said plurality of resistive heating elements being apportioned to one of a plurality of heating zones, a thermal energy output from each of said resistive heating elements capable of heating each of said heating zones to create a substantially isothermal environment throughout said cavity.

2. The apparatus of claim 1, wherein said process chamber is a tube made from material selected from the group consisting of quartz, $Al_2O_3$, and silicon carbide.

3. The apparatus of claim 1, wherein said process chamber is configured to be void of internal moving parts.

4. The apparatus of claim 1, wherein each of said resistive heating elements comprises a ceramic core wrapped with a wire comprising Al—Ni—Fe or NiCr alloy.

5. The apparatus of claim 1, wherein said process chamber has an aperture, said aperture being no greater than 40 mm in width.

6. The apparatus of claim 5, wherein an edge of said wafer is no less than 50 mm from said aperture when said wafer is placed within said cavity.

7. The apparatus of claim 1, wherein the thermal energy output of each of said resistive heating elements is controllable using a PID controller.

8. An apparatus for rapidly and uniformly heating a wafer during processing, the apparatus comprising:

a process chamber defining a cavity configured to receive a wafer therein and further defining a plurality of heating zones; and a plurality of resistive heating elements positioned proximate to said process chamber, each of said plurality of resistive heating elements being apportioned to one of said plurality of heating zones, a thermal energy output from each of said resistive heating elements capable of heating each of said zones to create a substantially isothermal environment throughout said cavity, said plurality of heating zones comprises a first zone and a second zone, said first zone having a width greater than the diameter of said wafer.

9. The apparatus of claim 1, wherein each of said plurality of heating zones comprises a temperature measuring device configured to send feedback information to a microprocessor.

10. The apparatus of claim 1, further comprising a heat diffusing material proximate to said plurality of heat resistive elements, said heat diffusing material causing said thermal energy output from each of said resistive heating elements to spread evenly through said cavity.

11. The apparatus of claim 10, wherein thermocouples are embedded within said heat diffusing material to measure the temperature of each of said heating zones.

12. The apparatus of claim 1, further comprising a means for quickly loading the wafer into said cavity.

13. A reactor for rapidly and uniformly heating a semiconductor wafer, the reactor comprising:

a chamber defining a cavity, said cavity further defining a plurality of heating zones said plurality of zones including a first zone having a width greater than a width of said wafer;

a plurality of resistive heating elements positioned proximate to said chamber, a portion of said plurality of resistive heating elements apportioned to each one of said plurality of heating zones; a thermal energy output of each of said resistive heating elements heating said zones to provide a substantially isothermal temperature among each of said zones.

14. The reactor of claim 13, wherein each of said resistive heating elements comprises a ceramic core and a resistive wire comprising Al—Ni—Fe.

15. The reactor of claim 13, wherein said cavity has an aperture no greater than 50 mm in width.

16. The reactor of claim 13, wherein each of said zones comprises a temperature sensor configured to sense fluctuations in temperature.

17. The reactor of claim 13, further comprising a heat diffusing material positioned proximate to said plurality of heat resistive elements, said heat diffusing material causing said thermal energy output from each of said resistive heating elements to be dissipated evenly through said cavity.

18. A method for processing a semiconductor wafer, the method comprising:

apportioning a portion of a plurality of resistive heating elements over a top portion and a bottom portion of a process chamber to define a plurality of heating zones; and generating a thermal output from said plurality of resistive heating elements to change the temperature of at least one of said heating zones in response to temperature fluctuations to provide a substantially isothermal environment over said semionductor wafer.

* * * * *

UNITED STATES PATENT AND TRADEMARK OFFICE
CERTIFICATE OF CORRECTION

PATENT NO. : 6,303,906 B1
DATED : October 16, 2001
INVENTOR(S) : Yoo, Woo Sik

It is certified that error appears in the above-identified patent and that said Letters Patent is hereby corrected as shown below:

<u>Title page,</u>
Item [73], should read as follows:
-- Assignee(s): Wafermasters, Inc., San Jose, CA, and Tokyo Electron Limited, Tokyo, Japan. --

Signed and Sealed this

Sixth Day of August, 2002

*Attest:*

JAMES E. ROGAN
*Attesting Officer*  *Director of the United States Patent and Trademark Office*